United States Patent [19]
Okazaki et al.

[11] Patent Number: 5,656,847
[45] Date of Patent: Aug. 12, 1997

[54] LED LAMP ARRANGEMENT AND LED MATRIX DISPLAY PANEL

[75] Inventors: Tadahiro Okazaki; Yoshinori Koike, both of Kyoto, Japan

[73] Assignee: Rohm Co., Ltd., Kyoto, Japan

[21] Appl. No.: 394,833

[22] Filed: Feb. 27, 1995

[30] Foreign Application Priority Data

Feb. 28, 1994 [JP] Japan .................. 6-029305

[51] Int. Cl.$^6$ .................................. H01L 31/0203
[52] U.S. Cl. .................. 257/433; 257/100; 257/787
[58] Field of Search ..................... 257/433, 100, 257/787

[56] References Cited

U.S. PATENT DOCUMENTS

| | | | |
|---|---|---|---|
| 3,609,475 | 9/1971 | Kaposhilin | 252/433 |
| 3,863,075 | 1/1975 | Ironmonger et al. | 252/433 |
| 4,032,963 | 6/1977 | Thome | 257/433 |
| 4,267,486 | 5/1981 | Thillays | 313/500 |

FOREIGN PATENT DOCUMENTS

| | | | |
|---|---|---|---|
| 59-94361 | 5/1984 | Japan | 257/100 |
| 63-293890 | 11/1988 | Japan | 257/100 |
| 4359483 | 11/1992 | Japan . | |
| 5-27688 | 2/1993 | Japan . | |
| 5-90643 | 4/1993 | Japan | 257/100 |

*Primary Examiner*—Mahshid D. Saadat
*Assistant Examiner*—T. M. Arroyo
*Attorney, Agent, or Firm*—Brumbaugh, Graves, Donohue & Raymond

[57] ABSTRACT

An LED lamp arrangement has at least one pair of lead terminals, an LED element attached to an end of one lead terminal, a metal wire connecting the LED element to the other lead terminal, a light-transmitting molded portion sealingly enclosing the ends of the lead terminals and the LED element, and a black coating on a rear surface of the molded portion to enhance recognition of the lighted condition of the LED lamp.

6 Claims, 2 Drawing Sheets

LED LAMP ARRANGEMENT AND LED MATRIX DISPLAY PANEL

BACKGROUND OF THE INVENTION

This invention relates to light emitting diode (LED) arrangements and, more particularly, to an LED arrangement providing improved contrast when lighted.

A light emitting diode, usually called an LED, has many advantages including, for example, low operating voltage, high response, small size, and long lifetime. Because of these advantages, LEDs are widely used as display lamps for various types of electronic devices and equipment.

As shown in FIG. 3, a conventional LED lamp includes a pair of lead terminals 21 and 22, an LED element 23 mounted at one end of the lead terminal 21, a metal wire 24 connecting the LED element 23 to one end of the second lead terminal 22, and a molded resin portion 25 encapsulating the end portions of the lead terminals 21 and 22 and the LED element 23 to seal them from the environment.

In one application of conventional LEDs, an array of LEDs is mounted on the control panel of an electric device to indicate the ON/OFF condition of switches in the electric device and to provide operating condition indicators on the control panel.

A display panel consisting of a matrix of conventional LED lamps, shown in FIGS. 4(A) and 4(B), has been widely used in highway message boards and in advertising boards. FIG. 4(A) is a front view of the conventional LED lamp and FIG. 4(B) is a side view of the same lamp. The matrix display panel includes a printed circuit board 27 containing a matrix of LED lamps 26, another printed circuit board 28 containing electronic parts for driving and controlling the matrix of LED lamps 26, and a housing 29 having a matrix of through-holes to receive the LED lamps 26. In operation, the LED lamps 26 thus arrayed are selectively turned on in response to control signals so as to display information consisting of characters, numerals, graphics, and the like.

When conventional LED lamp arrangements, such as control panels and display panels, are positioned in direct sunlight, the light is diffused in the molded portions of the unlighted LED lamps. As a result, the contrast between the lighted LED lamps and the unlighted LED lamps is poor so that it is difficult to discriminate the lighted LED lamps from the unlighted LED lamps and vice versa. Thus, visual recognition of the information to be provided by the LED lamps is difficult.

This recognition problem is particularly serious in matrix display panels which are installed in a bright outdoor location.

SUMMARY OF THE INVENTION

Accordingly, it is an object of the present invention to provide an LED lamp arrangement which overcomes the disadvantages of the prior art.

Another object of the invention is to provide an LED lamp arrangement which provides improved contrast and visual recognition when the arrangement is lighted, and a matrix display panel using such improved LED lamps.

These and other objects of the invention are attained by providing an LED lamp having at least one pair of lead terminals, an LED element attached to one end of one lead terminal, a metal wire connecting the LED element to one end of a second lead terminal, a light-transmitting molded portion sealingly enclosing the ends of the lead terminals and the LED element, and a black coating on a surface of the molded portion behind the LED element.

Further, the invention provides a matrix display panel comprising a first printed circuit board containing a matrix of such LED lamps, a second printed circuit board containing electronic parts for driving and controlling the array of the LED lamps, and a housing having a matrix of through-holes to receive the LED lamps.

Because the surface of the molded portion behind the LED element has a black coating, the back of the light emitting surface is dark. Accordingly, the contrast between the lighted condition and the unlighted condition of the LED lamps 7 is improved so that it is possible to distinguish easily the lighted condition of the LED lamp from the unlighted condition.

With a matrix array of such LED lamps, the contrast is also improved in the matrix display panel. Consequently, visual recognition for the information provided by the display panel is remarkably improved even though the LED lamps are disposed in a dense array in the panel.

BRIEF DESCRIPTION OF THE DRAWINGS

Further objects and advantages of the invention will be apparent from a reading of the following description in conjunction with the accompanying drawings, in which.

DETAILED DESCRIPTION OF PREFERRED EMBODIMENTS

A preferred embodiment of the present invention will be described with reference to FIGS. 1 and 2.

Figure 1:
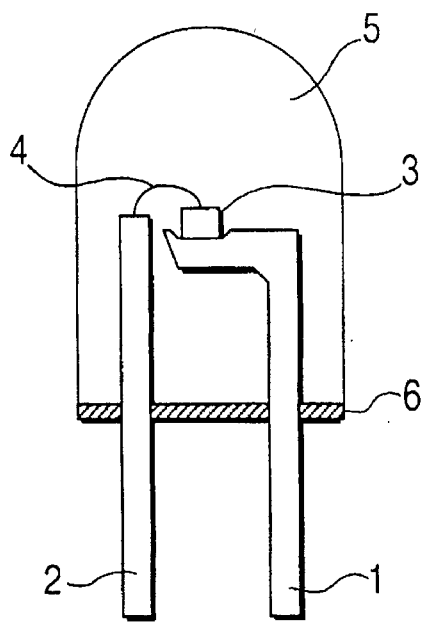
FIG. 1 is a cross-sectional view showing a representative embodiment of an LED lamp arrangement according to the present invention.
Figure 3:
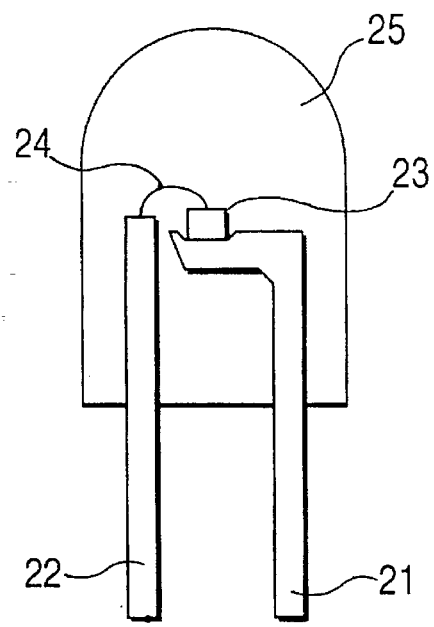
FIG. 3 is a cross-sectional view showing the arrangement of a conventional LED lamp.
Figure 4A:
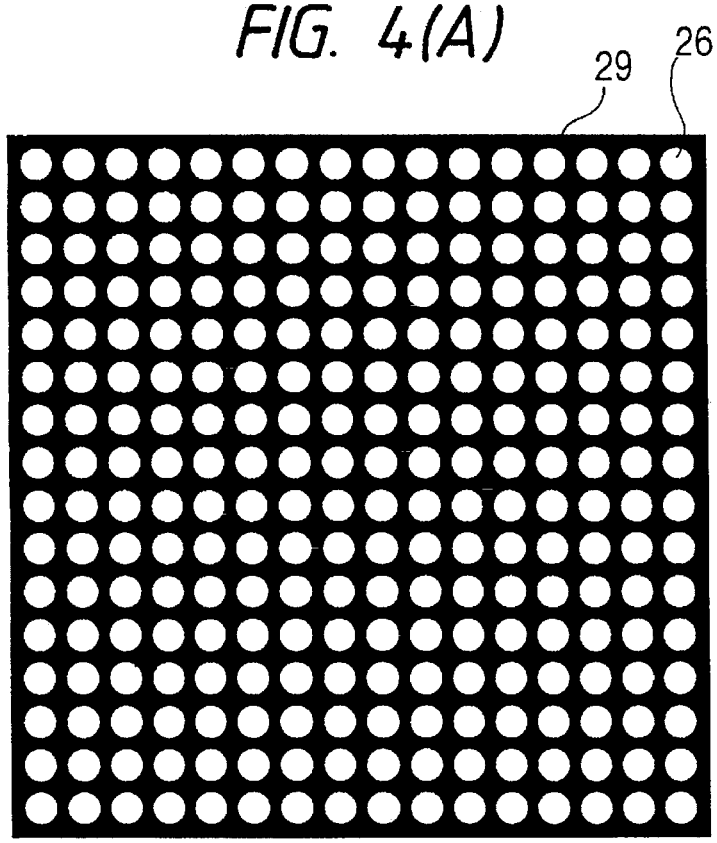
FIGS. 4(A) and 4(B) are front and side views, respectively, showing a conventional matrix display panel using the LED lamps of FIG. 4.
Figure 4B:
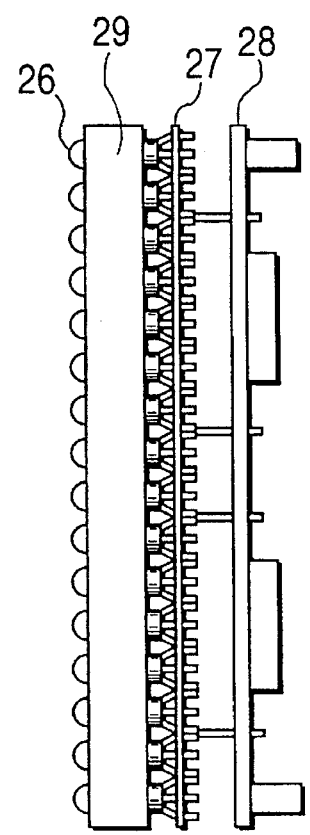

FIG. 1 shows a typical LED lamp arrangement constructed according to the present invention. The LED lamp includes a pair of metal lead terminals 1 and 2 and an LED element 3, made of GaP, GaAs or the like, electrically bonded to the upper end of the lead terminal 1 as seen in FIG. 1. The LED element 3 is also connected to the adjacent end of the lead terminal 2 by a metal wire 4. The end portions of the lead terminals 1 and 2 and the LED element 3 are sealingly enclosed within a transparent or semitransparent resin, such as an epoxy resin, which forms a molded portion 5. In accordance with the invention, the bottom surface of the molded portion 5, behind the LED element 3, is provided with a black coating 6.

The LED element 3 is formed by a method as follows. A pair of lead terminals connected each other is inserted into a molding chamber made of polypropylene. The LED element 3 is mounted on one lead terminal, and is connected to the adjacent end of the other lead terminal by a metal wire. Next, a melted resin such as an epoxy resin whose color is milk-white, semitransparent, or transparent is inserted into the chamber. Then, after the melted resin stiffens, a black liquid or elastic acrylic type resin is provided on a bottom face of the resin by spraying. Finally, the resin is removed from the chamber. The surface coating is not restricted to the above example, and may be made of UV resin which stiffens by irradiating UV beam, or a tape.

With this LED lamp arrangement, most of light emitted by the LED element 3 is emitted upwardly as seen in FIG. 1. Since the bottom face of the molded portion 5, which is located behind the LED element 3, is provided with black coating, the background for the light emitting surface is dark, creating a good contrast.

Figure 2A:
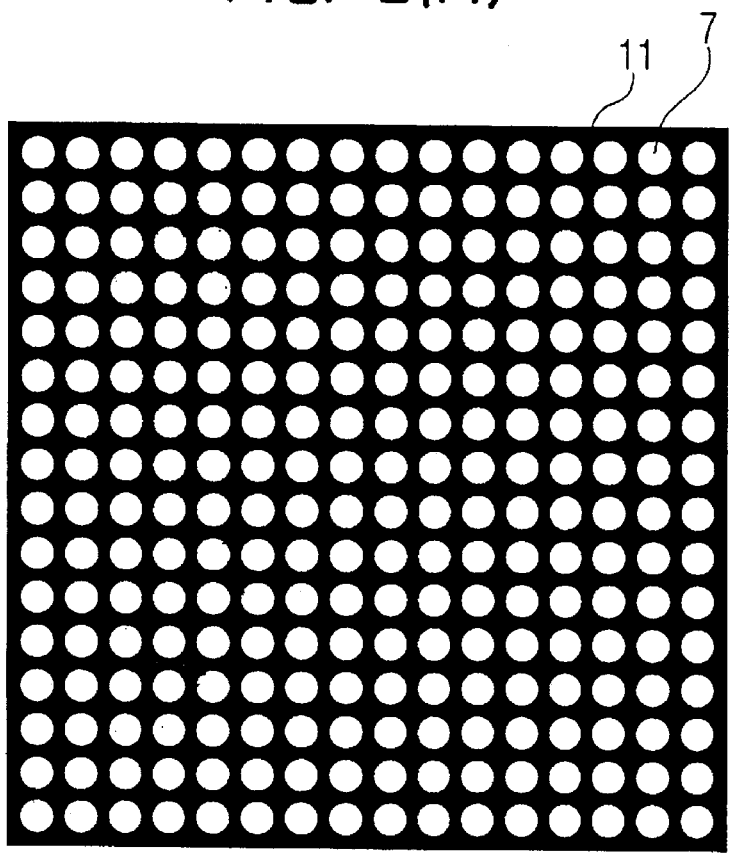
FIGS. 2(A), 2(B), and 2(C) are respectively a front view and a side view of a matrix display panel using the LED lamps of FIG. 1, and a fragmentary cross-sectional view showing a key portion of the matrix display panel containing an LED lamp.
Figure 2B:
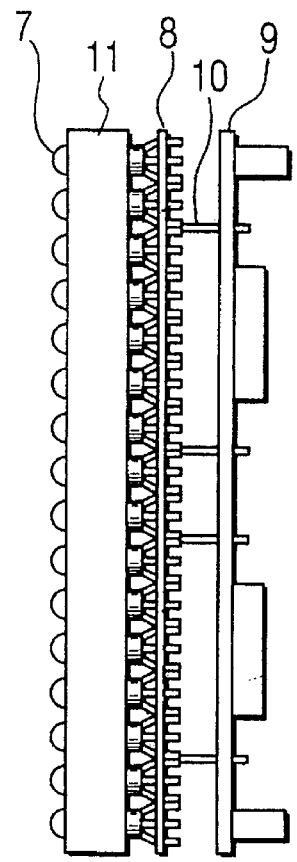
Figure 2C:
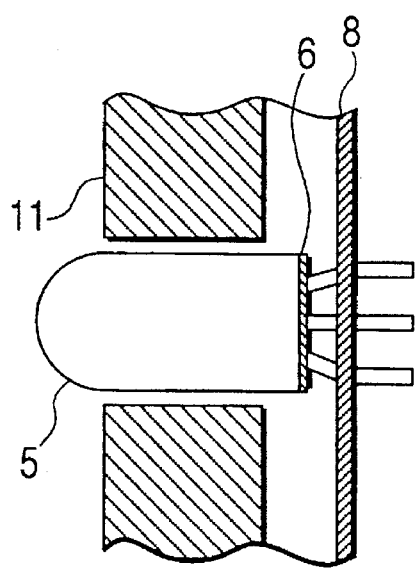

FIGS. 2(A) and 2(B) are a front view and a side view, respectively, of a matrix display panel according to the present invention, and FIG. 2(C) is a cross-sectional view of a portion of the matrix display panel containing one LED lamp. In this panel, an array of LED lamps 7 is mounted on a first printed circuit board 8 in the form of a matrix. Each of the LED lamps in the matrix has its rear surface provided with a black coating 6. To mount the LED lamps 7 on the first printed circuit board 8, the lead wires of the LED lamps 7 in the matrix are inserted into corresponding through-holes located at predetermined positions in the first printed circuit board, and the lead wires are then soldered to the wiring of the first printed circuit board.

An integrated circuit for driving the LED lamps 7, and other electronic parts such as capacitors and transistors, are mounted on a second printed circuit board 9 and the first and second printed circuit boards 8 and 9 are electrically interconnected by appropriate conductors 10.

A housing 11 is then mounted on the side of the first printed circuit board 8 on which the LED lamps 7 are mounted. The housing 11 is formed with through-holes arrayed in a matrix corresponding to the matrix of LED lamps 7. The surface of the housing 11 is provided with a black coating to facilitate distinguishing the lighted and unlighted condition of the LED lamps 7.

With the black coating on the surface of the housing 11 and the black coating 6 on the rear surface of each of the LED lamps 7, the lighted LED lamps are easily distinguished from the unlighted LED lamps. Accordingly, it is easy to recognize the information provided by the lighted LED lamps 7.

The color of the coating is not restricted in black, and may be dark color such as dark blue or navy blue.

The dark background for the light emitting element in each LED lamp is provided on the rear face of the molded portion of the lamp with a black coating. With this black coating, the contrast between the lighted condition and the unlighted condition of the LED lamps 7 is improved to such an extent that anyone can discriminatively recognize the lighted condition of the lamp from the unlighted condition.

The contrast in the matrix display panel consisting of a matrix array of the LED lamps is also improved, especially in an outdoor environment. Moreover, the visual recognition of information provided by the display panel is remarkably improved even if the LED lamps are densely arrayed on the panel.

Although the invention has been described herein with reference to specific embodiments, many modifications and variations therein will readily occur to those skilled in the art. Accordingly, all such variations and modifications are included within the intended scope of the invention.

What is claimed is:

1. An LED lamp arrangement comprising at least one pair of lead terminals,
   an LED element electrically joined to an end of one of the pair of lead terminals,
   a metal wire connecting the LED element to an end of the other of the pair of lead terminals,
   a molded portion made of light-transmissive resin, sealingly enclosing the ends of the lead terminals and the LED element, and
   a dark material applied to a rear surface of the molded portion to provide a dark background behind the LED element.

2. The LED lamp arrangement of claim 1, wherein the color of said background is selected from a group of black, dark blue, and navy blue.

3. The LED lamp arrangement of claim 1, wherein said background is made of a material which is selected from acrylic type resin, UV resin, and tape.

4. An LED matrix display panel, comprising:
   a first printed circuit board, containing a matrix of LED lamps each having lead terminals, an LED element, a light-transmissive molded portion enclosing ends of the terminals and the LED element, and a dark material applied to a rear surface of the molded portion to provide a dark background behind the LED element;
   a second printed circuit board containing electronic parts for driving and controlling the LED lamps in the matrix; and
   a housing having a matrix of through-holes to receive the LED lamps.

5. The LED matrix display panel of claim 4, wherein the color of said background is selected from a group of black, dark blue, and navy blue.

6. The LED matrix display panel of claim 4, wherein said background is made of a material which is selected from acrylic type resin, UV resin, and tape.

* * * * *